(12) United States Patent
Zhu et al.

(10) Patent No.: US 11,302,638 B2
(45) Date of Patent: Apr. 12, 2022

(54) HYBRID CONDUCTOR INTEGRATION IN POWER RAIL

(71) Applicant: QUALCOMM Incorporated, San Diego, CA (US)

(72) Inventors: John Jianhong Zhu, San Diego, CA (US); Stanley Seungchul Song, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/738,127

(22) Filed: Jan. 9, 2020

(65) Prior Publication Data

US 2021/0217699 A1    Jul. 15, 2021

(51) Int. Cl.
*H01L 23/528* (2006.01)
*H01L 23/522* (2006.01)
*H01L 23/532* (2006.01)
*H01L 21/768* (2006.01)
*H01L 23/535* (2006.01)

(52) U.S. Cl.
CPC ...... *H01L 23/5286* (2013.01); *H01L 21/7684* (2013.01); *H01L 21/76805* (2013.01); *H01L 21/76847* (2013.01); *H01L 21/76877* (2013.01); *H01L 21/76895* (2013.01); *H01L 23/5226* (2013.01); *H01L 23/535* (2013.01); *H01L 23/53209* (2013.01); *H01L 23/53238* (2013.01); *H01L 23/53252* (2013.01); *H01L 23/53266* (2013.01)

(58) Field of Classification Search
CPC ............. H01L 23/5286; H01L 23/5226; H01L 23/53209; H01L 23/53238; H01L 23/53252; H01L 21/76895; H01L 23/535; H01L 21/76805; H01L 21/7684; H01L 21/76847; H01L 21/76877; H01L 23/53266
See application file for complete search history.

(56) References Cited

U.S. PATENT DOCUMENTS

2016/0343708 A1* 11/2016 Park .................. H01L 29/41791

* cited by examiner

*Primary Examiner* — Shahed Ahmed
*Assistant Examiner* — Vicki B. Booker
(74) *Attorney, Agent, or Firm* — Patterson & Sheridan, L.L.P.

(57) ABSTRACT

Certain aspects of the present disclosure generally relate to integration of a hybrid conductor material in power rails of a semiconductor device. An example semiconductor device generally includes an active electrical device and a power rail. The power rail is electrically coupled to the active electrical device, disposed above the active electrical device, and embedded in at least one dielectric layer. The power rail includes a first conductive layer, a barrier layer, and a second conductive layer. In certain cases, copper may be used as conductive material for the second conductive layer. The barrier layer is disposed between the first conductive layer and the second conductive layer.

20 Claims, 9 Drawing Sheets

HYBRID CONDUCTOR INTEGRATION IN POWER RAIL

BACKGROUND

Field of the Disclosure

Certain aspects of the present disclosure generally relate to electronic circuits and, more particularly, to integration of a hybrid conductor material in power rails of integrated circuits with active electrical devices.

Description of Related Art

As electronic devices are getting smaller and faster, the demand for integrated circuits (ICs) with higher I/O count, faster data processing rate, and/or better signal integrity greatly increases. The ICs may include various layers of conductors (e.g., metal layers) disposed between layers of dielectric material, which are formed during a back-end-of-line (BEOL) fabrication process. The conductors facilitate electrical wiring to various electrical components including transistors, amplifiers, inverters, control logic, memory, power management circuits, buffers, filters, resonators, capacitors, inductors, resistors, etc.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved power rail within integrated circuits.

Certain aspects of the present disclosure provide a semiconductor device. The semiconductor device generally includes an active electrical device and a power rail. The power rail is electrically coupled to the active electrical device, disposed above the active electrical device, and embedded in at least one dielectric layer. The power rail comprises a first conductive layer, a barrier layer, and a second conductive layer comprising copper. The barrier layer is disposed between the first conductive layer and the second conductive layer.

Certain aspects of the present disclosure provide a method of fabricating a semiconductor device. The method generally includes forming at least one dielectric layer above an active electrical device and forming a power rail in the at least one dielectric layer. The power rail comprises a first conductive layer, a barrier layer, and a second conductive layer comprising copper. The barrier layer is disposed between the first conductive layer and the second conductive layer To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure generally relate to integration of a hybrid conductor material into a power rail of an integrated circuit with an active electrical device. In the micro-electronic technology industry, there is a continuous demand and evolution of processes, technologies, and assembly methodologies to design and implement smaller, more efficient integrated circuits (ICs). To achieve the smaller IC size, the IC may be fabricated with fine architectural designs inside and outside a package. In certain cases, copper may be used as the conductive material for various power rails. In order to facilitate deposition of the copper and reduce electromigration (EM) of the copper, a barrier-seed layer may be initially deposited in cavities in dielectric layers of the IC. With continuous scaling, for example, in cases where the metal pitch is less than 25 nm, copper power rails may exhibit an increased resistance compared to other conductive materials. As the metal pitch decreases, the barrier-seed layer may take a greater proportion of the power rail affecting the scaling and electrical properties of the power rail.

Aspects of the present disclosure provide a semiconductor device having a power rail with a hybrid conductive material. In aspects, the hybrid conductive material may be integrated into the power rail layer and a via layer coupled to the terminals of an active electrical device, such as a transistor. The power rail with the hybrid conductive material described herein may provide a reduced resistance compared to a copper power rail with similar dimensions.

Figure 1:
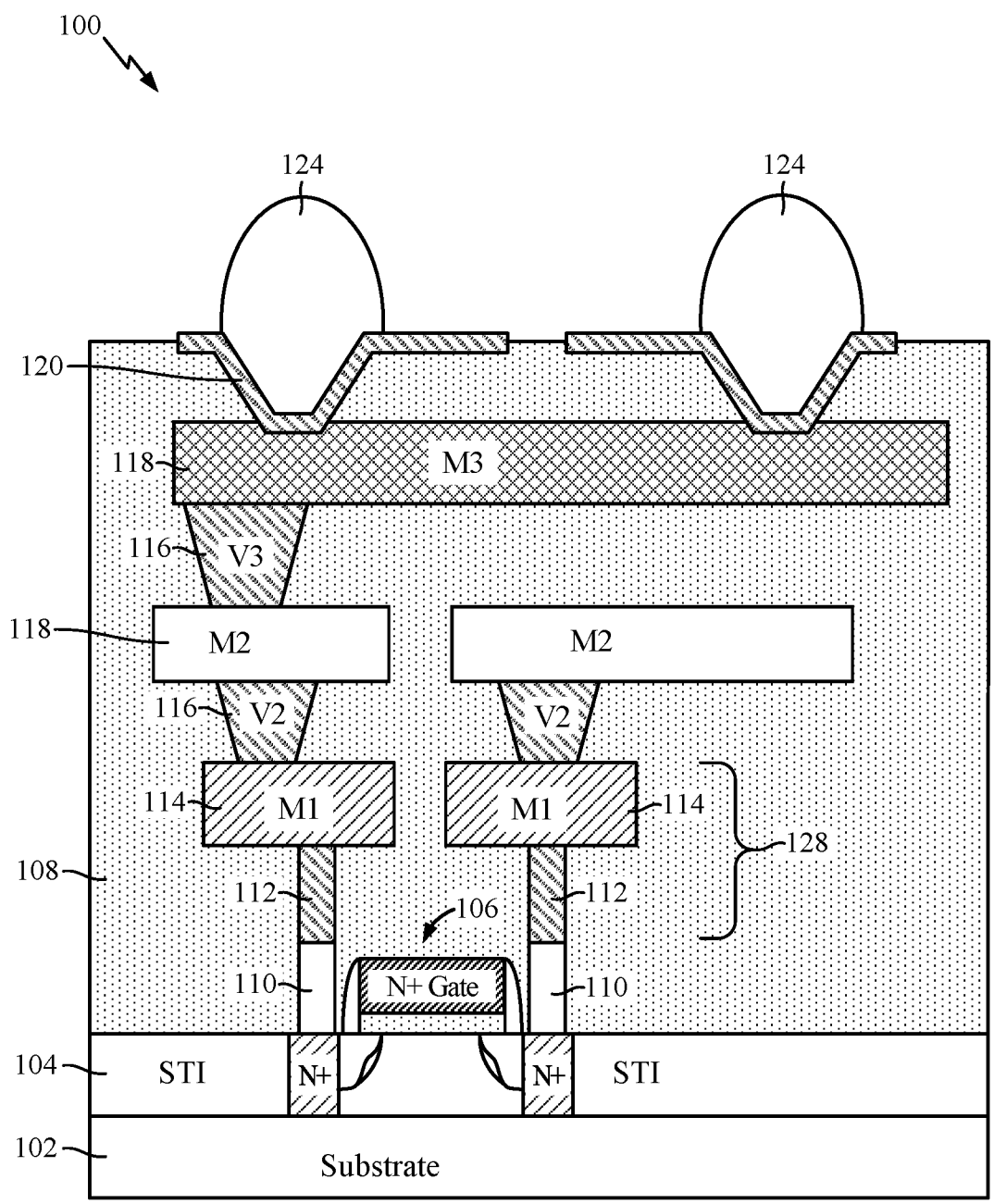
FIG. 1 is a cross-sectional view of an example semiconductor device having a power rail, in accordance with certain aspects of the present disclosure.

FIG. 1 is a cross-sectional view of an example semiconductor device 100 that has a hybrid conductive material integrated in a power rail and via layer, in accordance with certain aspects of the present disclosure. As shown, the semiconductor device 100 may include a substrate 102, a dielectric region 104, an active electrical device 106 (e.g., a transistor), one or more dielectric layers 108, local conductive interconnects 110 (e.g., source-drain conductive contacts which are often abbreviated as CA), first conductive vias 112, and a first layer of conductive traces 114 (e.g., metal layer one M1). In certain aspects, the semiconductor device 100 may include additional conductive vias 116, additional layers of conductive traces 118 (e.g., metal layer two M2 and metal layer three M3), under-bump conductive pads 124, and solder bumps 126.

The substrate 102 may be, for example, a portion of a semiconductor wafer including a silicon wafer. The dielectric region 104 may be disposed above the substrate 102. The dielectric region 104 may comprise an oxide, such as silicon dioxide ($SiO_2$). In aspects, the dielectric region 104 may be a shallow trench isolation (STI) region configured to electrically isolate the active electrical device 106 from other electrical components, such as other electrical devices.

The active electrical device 106 may be disposed above the substrate 102. In this example, the active electrical device 106 may include one or more transistors. The active electrical device 106 may include metal-oxide-semiconductor field-effect transistors (MOSFETs). In aspects, the MOSFETs may include fin field-effect transistors (finFETs) and/or gate-all-around (GAA) FETs. In certain aspects, the active electrical device 106 may be an inverter, amplifier, and/or other suitable electrical devices comprising transistors. The local conductive interconnects 110 may be electrically coupled to the active electrical device 106. For example, the source and/or drain of the active electrical device 106 may be electrically coupled to the local conductive interconnects 110, which are electrically coupled to the first conductive vias 112. In certain aspects, the active electrical device 106 may be formed during a front-end-of-line (FEOL) fabrication process.

Figure 2A:
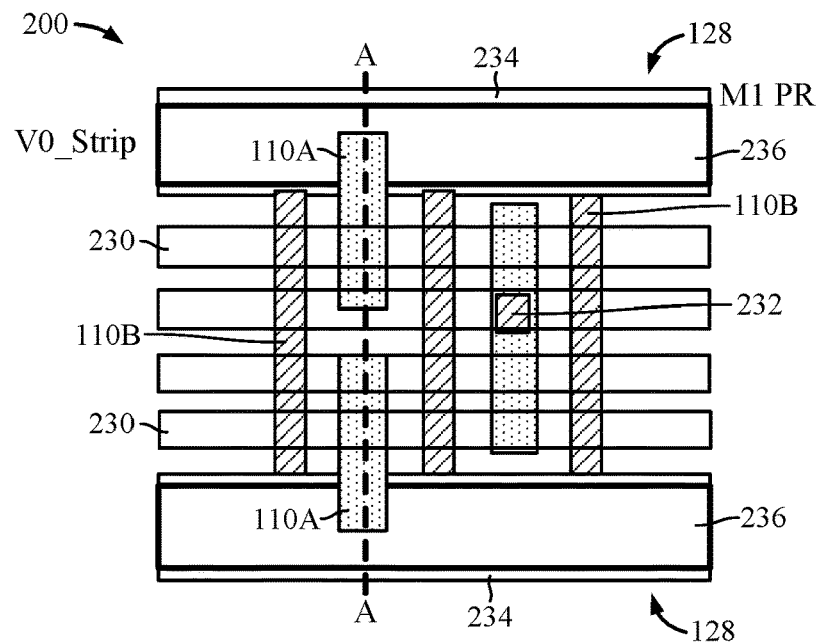
FIG. 2A is a top view of example conductive wiring of a semiconductor device, in accordance with certain aspects of the present disclosure.
Figure 2B:
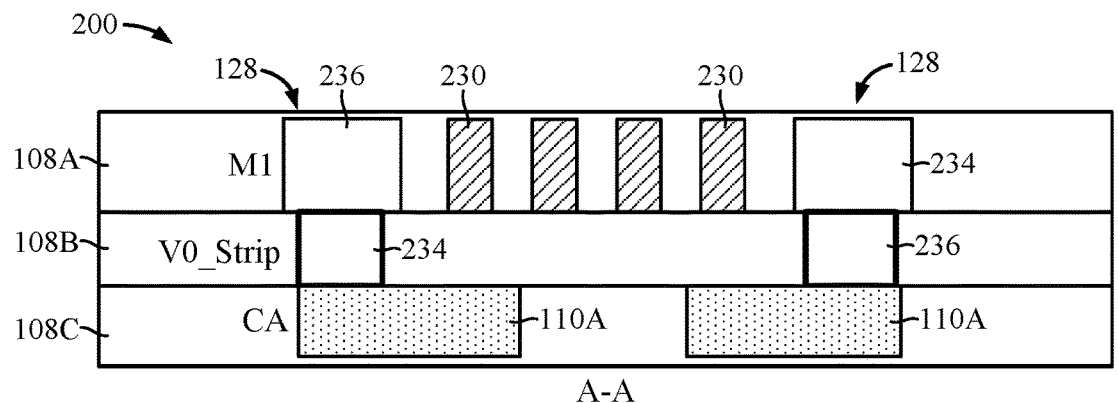
FIG. 2B is a cross-sectional view taken along line segment A-A of FIG. 2A illustrating the conductive wiring, in accordance with certain aspects of the present disclosure.
Figure 2C:
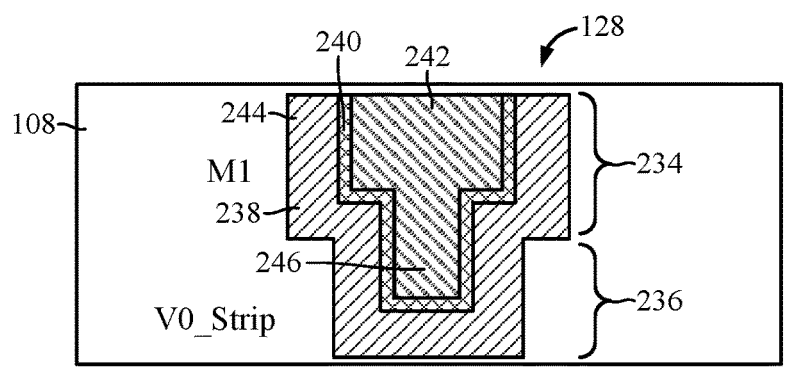
FIG. 2C is a cross-sectional view of an example power rail, in accordance with certain aspects of the present disclosure.

In aspects, the first conductive vias 112 and first layer of conductive traces 114 may be integrated as one or more power rails 128 as further described herein with respect to FIGS. 2A-2C. In aspects, the power rail 128 may include a hybrid conductive material, for example, including a first conductive layer, a barrier/seed layer, and a second conductive layer. The first conductive layer may include cobalt (Co), ruthenium (Ru), molybdenum (Mo), or tungsten (W), and the second conductive layer may include copper (Cu).

The first conductive vias 112 may include a conductive via strip that extends longitudinally with a metal layer portion of the first layer of conductive traces 114. The first conductive via 112 may be the closest conductive via disposed above the active electrical device 106, and at least one of the additional conductive vias 116 may be the next closest conductive via disposed above the active electrical device 106.

The first conductive via 112 and first layer of conductive traces 114 may be disposed above electrical components (e.g., the active electrical device 106) and formed during a back-end-of-line (BEOL) fabrication process of the semiconductor device 100. In aspects, the first conductive via 112 and first layer of conductive traces 114 may be embedded in the dielectric layers 108. The dielectric layers 108 may comprise an oxide, such as silicon dioxide.

The first layer of conductive traces 114 may be disposed above the first conductive vias 112. The first layer of conductive traces 114 may be the closest layer of conductive traces disposed above the active electrical device 106, and at least one of the additional layer of conductive traces 118 may be the next closest layer of conductive traces disposed above the active electrical device 106.

The conductive vias 112, 116 and layers of conductive traces 114, 118 provide electrical routing between the active electrical device 106 and other electrical components (not shown), including, for example, capacitors, inductors, resistors, an integrated passive device, a power management IC (PMIC), a memory chip, etc. In aspects, the additional conductive vias 116 and additional layers of conductive traces 118 may be embedded in the dielectric layers 108 and formed during the BEOL fabrication process of the semiconductor device 100.

In this example, the semiconductor device 100 may be a flip-chip ball grid array (FC-BGA) integrated circuit having multiple solder bumps 126 electrically coupled to the under-bump conductive pads 124. In certain cases, the semiconductor device 100 may have conductive pillars (e.g., copper (Cu) pillars) that electrically couple the semiconductor device 100 to a package substrate, an interposer, or a circuit board, for example.

Example Hybrid Conductor Integration in Power Rail

FIG. 2A illustrates a top view of example conductive wiring 200 of a semiconductor device (e.g., the semiconductor device 100) with a hybrid conductor integrated in the power rail, in accordance with certain aspects of the present disclosure. As shown, the conductive wiring 200 includes power rails 128, local conductive interconnects 110A-B (jointly 110), signal lines 230, and one or more conductive vias 232. The power rail 128 includes a metal layer portion 234 disposed above a via layer portion 236. In aspects, the first layer of conductive traces 114 of FIG. 1 may include the metal layer portion 234, and the first conductive vias 112 of FIG. 1 may include the via layer portion 236. In other words, the metal layer portion 234 may be a conductive portion that is in a metal layer (e.g., the first layer of conductive traces 114) disposed closest to an active electrical device relative to other metal layers (e.g., the additional layers of conductive traces 118) of the semiconductor device. The via layer portion 236 may be electrically coupled to the local conductive interconnect 110A, which may be electrically coupled to a source or drain of an active electrical device (e.g., the active electrical device 106). In certain aspects, the local conductive interconnects 110B may be electrically coupled to a gate of the active electrical device.

The signal lines 230 may be conductive traces, each of which is laterally spaced from at least one of the power rails 128. In aspects, the signal lines 230 may be disposed between the power rails 128. In aspects, the signal lines 230 may be disposed in the same metal layer (e.g., the first layer of conductive traces 114) as the metal layer portion 234. In certain aspects, the signal lines 230 may include the same conductive material (for example including cobalt, ruthenium, molybdenum, or tungsten) as the power rails 128. With reduced electromigration and a preferable metal fill capability of certain conductive materials (e.g., cobalt), the signal line 230 may have a thin width (e.g., width<half-pitch) with a relatively high metal aspect ratio, and in certain cases the metal pitch may be aggressive, for example, less than 30 nm.

The conductive vias 232 may be disposed between the signal lines 230 and the local conductive interconnects 110. Although in this example only a single conductive via 232 is depicted, other conductive vias may be coupled between the various signal lines 230 and local conductive interconnects 110. In aspects, the conductive vias 232 are electrically coupled to the signal lines 230 and local conductive interconnects 110.

In aspects, the local conductive interconnects 110 include the same conductive material (e.g., including cobalt, ruthenium, molybdenum, or tungsten) as the power rails 128.

FIG. 2B illustrates a cross-sectional view of the conductive wiring 200 along the cross-section taken across line segment A-A as depicted in FIG. 2A, in accordance with certain aspects of the present disclosure. As shown, each of the power rails 128 is electrically coupled to a separate local conductive interconnect 110A. In aspects, the metal layer portion 234 of the power rail 128 may be integrated with the via layer portion 236, which is disposed between the metal layer portion 234 and the local conductive interconnect 110A. In aspects, the metal layer portion 234 is disposed above and overhangs the via layer portion 236 on at least one side of the power rail 128. In aspects, the width of the via layer portion 236 may be widened by a suitable cell height, fin positioning (in case of a finFET), nano-slab/-sheet positioning (in case of a GAA FET), and/or width setting of the nano-slab/-sheet.

In aspects, the conductive wiring 200 may be embedded in one or more dielectric layers 108A-C (jointly 108). In certain cases, the metal layer portion 234 is embedded in a first dielectric layer 108A of the dielectric layers 108. The via layer portion 236 is embedded in a second dielectric layer 108B of the dielectric layers 108. The local conductive interconnects 110 may be embedded in a third dielectric layer 108C of the dielectric layers 108. In aspects, the first dielectric layer 108A is disposed above the second dielectric layer 108B, which is disposed above the third dielectric layer 108C. In aspects, the second dielectric layer 108B is disposed between the metal layer portion 234 and the active electrical device (e.g., the active electrical device 106).

FIG. 2C illustrates a cross-sectional view of an example power rail 128, in accordance with certain aspects of the present disclosure. As shown, the power rail 128 includes a first conductive layer 238, a barrier layer 240, and a second conductive layer 242. The barrier layer 240 is disposed between the first conductive layer 238 and second conductive layer 242. In aspects, lateral surfaces of the second conductive layer may be coupled, for example via the barrier layer 240, to the first conductive layer in the via layer portion 236.

In aspects, the first conductive layer 238 may include at least one of cobalt (Co), ruthenium (Ru), molybdenum (Mo), or tungsten (W). In aspects, the barrier layer 240 may include at least one of tantalum (Ta), tantalum nitride (TaN), titanium nitride (TiN), or titanium-tungsten (TiW). In aspects, the second conductive layer 242 includes copper (Cu). In certain aspects, the barrier layer 240 may include a conductive material that reduces and/or prevents electromigration of the second conductive layer 242. In aspects, the barrier layer 240 may serve as a seed layer when forming or depositing the second conductive layer 242.

In aspects, the first conductive layer 238 engages at least one of the dielectric layers 108 on multiple surfaces 244 of the power rail 128. In certain aspects, the via layer portion 236 of the power rail 128 may include a copper pillar 246 associated with the second conductive layer 242, where lateral surfaces of the copper pillar 246 are surrounded by at least one of the barrier layer 240 or the first conductive layer 238 in the via layer portion 236.

FIGS. 3A-3G illustrate example operations for fabricating a power rail using a single damascene process, in accordance with certain aspects of the present disclosure. The operations may be performed by an integrated circuit processing facility, for example. FIGS. 3A-3G illustrate cross-sectional views of the example operations described herein. The operations may include various BEOL operations, where BEOL operations may include the operations to form various conductive connections used to interconnect electrical devices in an integrated circuit.

Figure 3A:
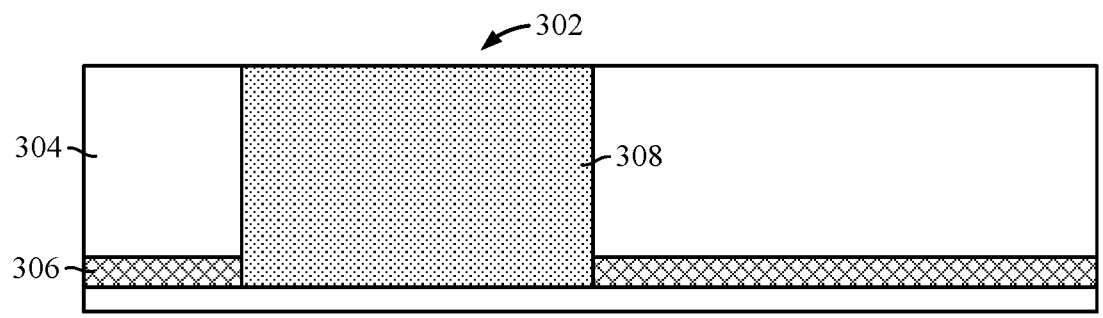
FIG. 3A illustrates a cross-sectional view of a first dielectric layer with a first trench formed therein, in accordance with certain aspects of the present disclosure.

As shown in FIG. 3A, a first trench 302 may be formed in a first dielectric layer 304, for example, using an etching process (e.g., a dry etching and/or wet etching process). In aspects, the first trench 302 may serve as the mold for forming a via layer portion of the power rail, for example, as depicted in FIG. 2A. In aspects, the first trench 302 may also intersect a first etch stop layer 306 (e.g., a hard mask comprising silicon nitride) disposed below the first dielectric layer 304. The first trench 302 may be filled with a sacrificial material 308 (e.g., a material including organic SiCOH). In aspects, the first dielectric layer 304 may correspond to the second dielectric layer 108B of FIG. 2B. In certain aspects, multiple trenches may be formed in the first dielectric layer 304 and/or first etch stop layer 306.

Figure 3B:
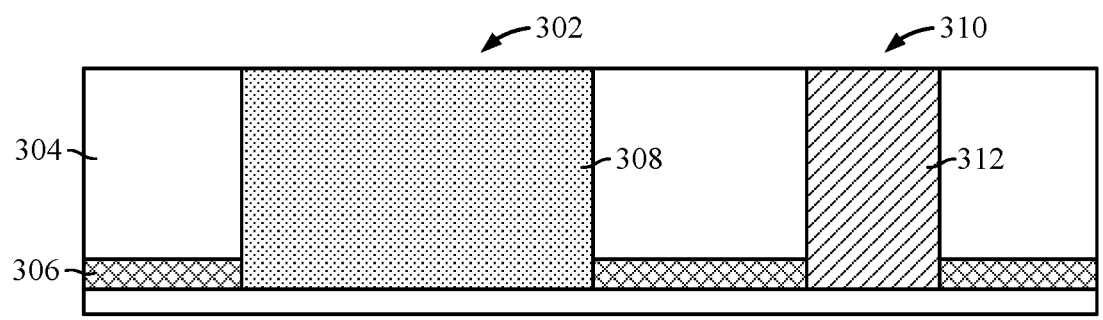
FIG. 3B illustrates a cross-sectional view of the first dielectric layer with a cavity formed therein, in accordance with certain aspects of the present disclosure.

Referring to FIG. 3B, a cavity 310 may be formed in the first dielectric layer 304, for example, using an etching process such as a dry etching and/or wet etching process. The cavity 310 may serve as the mold for forming a conductive via (e.g., the conductive via 232 of FIG. 2A). The cavity 310 may also intersect the first etch stop layer 306.

The cavity 310 may be filled with a conductive material 312, for example, including at least one of cobalt (Co), ruthenium (Ru), molybdenum (Mo), or tungsten (W). In aspects, the conductive material 312 may include the same conductive material as the first conductive layer of the power rail, for example, as described herein with respect to FIG. 2B. In certain aspects, a planarization process (e.g., a chemical-mechanical planarization (CMP) process) may be performed to smooth the surface of the first dielectric layer 304 and remove any excess conductive material. In certain aspects, multiple cavities may be formed in the first dielectric layer 304.

Figure 3C:
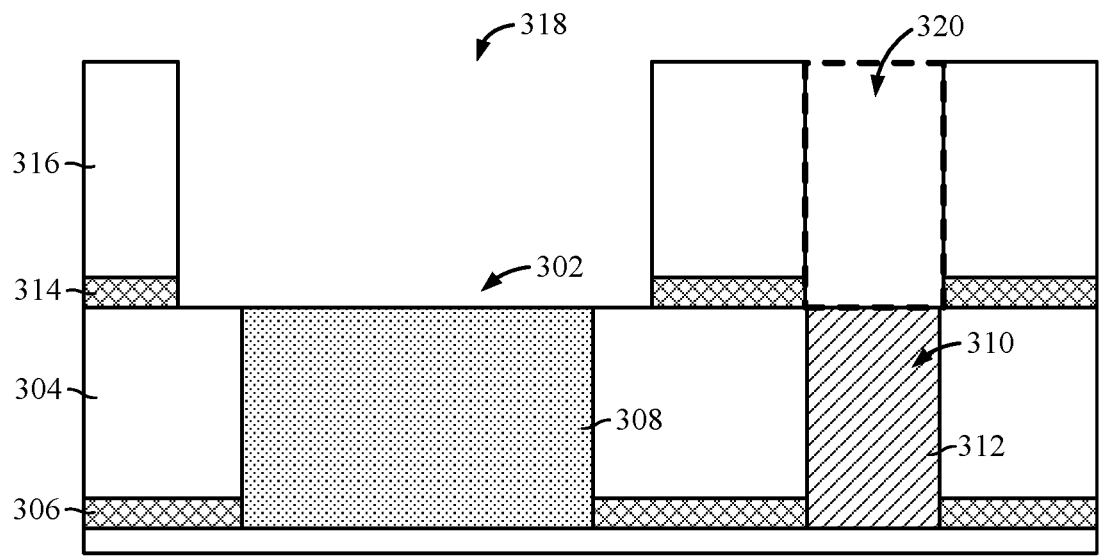
FIG. 3C illustrates a cross-sectional view of a second dielectric layer with second and third trenches formed therein, in accordance with certain aspects of the present disclosure.

As depicted in FIG. 3C, a second etch stop layer 314 may be formed above the first dielectric layer 304, and a second dielectric layer 316 may be formed above the second etch stop layer 314. In aspects, the second dielectric layer 316 may correspond to the first dielectric layer 108A of FIG. 2B. A second trench 318 and third trench 320 may be formed in the second dielectric layer 316, for example, using an etching process (e.g., a dry etching and/or wet etching process). In aspects, the second trench 318 may serve as a mold for forming a metal layer portion of the power rail, and the third trench 320 may serve as a mold for forming a signal line, for example, as depicted in FIG. 2A. In aspects, the second trench 318 and/or third trench 320 may also intersect the second etch stop layer 314. The second trench 318 may be disposed above the first trench 302 filled with the sacrificial material 308. In aspects, the second trench 318 may be wider than the first trench 302 and overhang the first trench 302 on at least one side of the first trench 302. The third trench 320 may be laterally spaced from the second trench 318 and disposed above the cavity 310 filled with the conductive material 312.

Figure 3D:
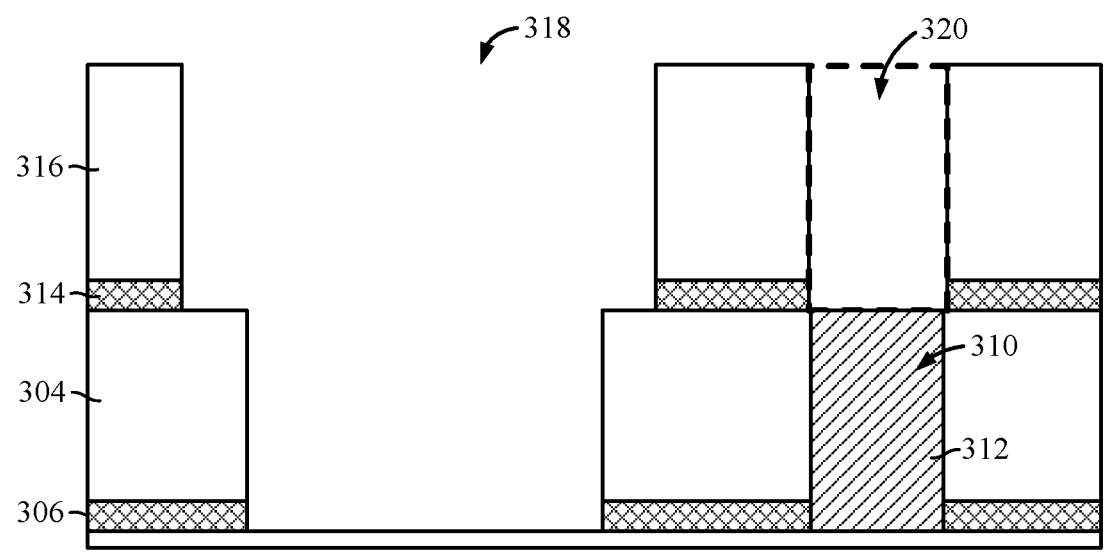
FIG. 3D illustrates a cross-sectional view of expanding the second trench to intersect the first dielectric layer, in accordance with certain aspects of the present disclosure.

As illustrated in FIG. 3D, the second trench 318 may be expanded by removing the sacrificial material 308 in the first trench 302. In other words, the second trench 318 and first trench 302 may be integrated to form a single trench that serves as a combined mold for the via layer portion and metal layer portion of the power rail.

Figure 3E:
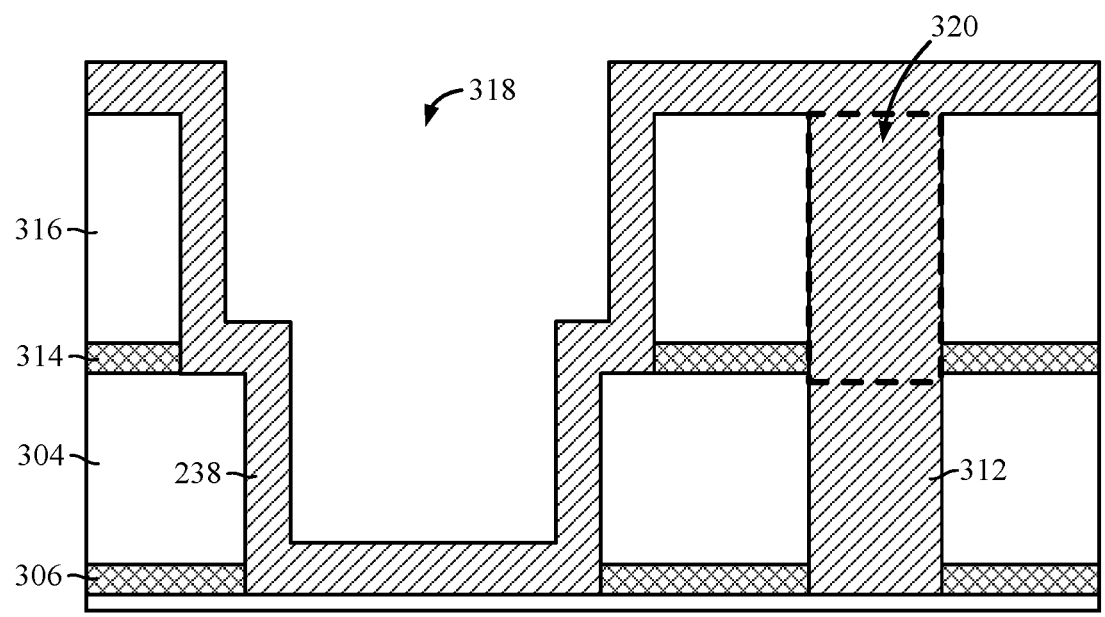
FIG. 3E illustrates a cross-sectional view of a first conductive layer disposed in the second trench and third trench, in accordance with certain aspects of the present disclosure.

Referring to FIG. 3E, the first conductive layer 238 may be formed in the second trench 318 and third trench 320. Inside the second trench 318, the first conductive layer 238 may engage the surfaces of the first dielectric layer 304 and second dielectric layer 316. In certain aspects, the first conductive layer 238 may include the conductive material 312, such that the third trench 320 is filled with the conductive material 312.

Figure 3F:
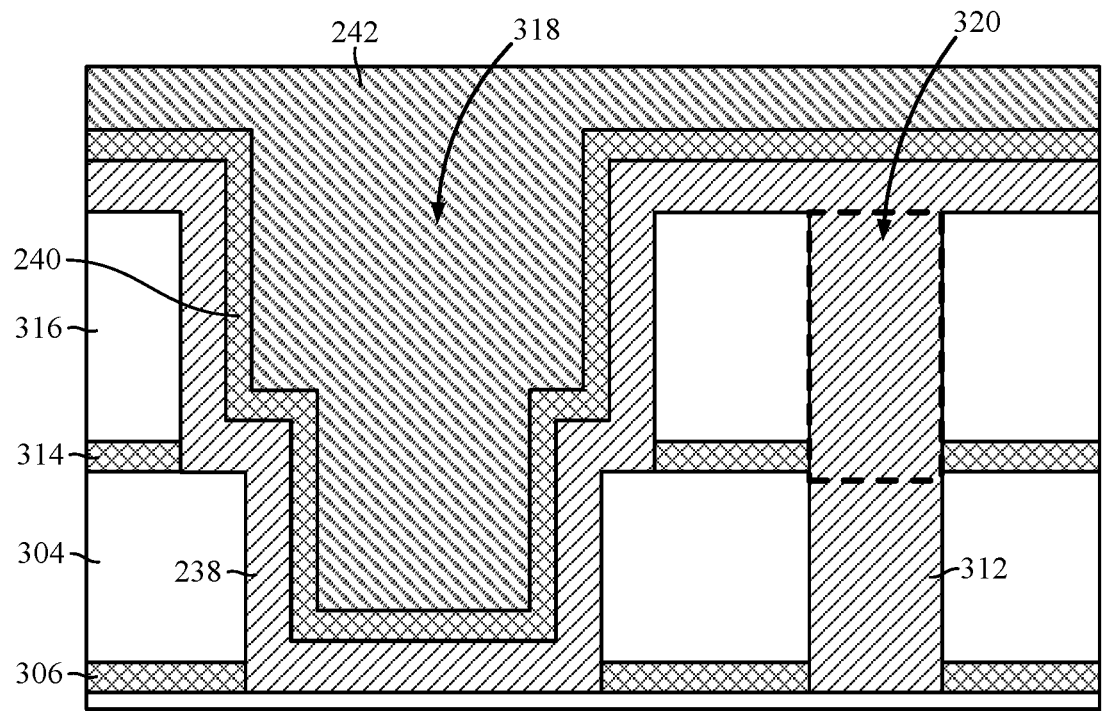
FIG. 3F illustrates a cross-sectional view of a barrier layer and second conductive layer disposed in the second trench, in accordance with certain aspects of the present disclosure.

As depicted in FIG. 3F, the barrier layer 240 may be formed above the first conductive layer 238 in the second trench 318. In other words, the first conductive layer 238 may be disposed between the barrier layer 240 and the surfaces of the first dielectric layer 304 and second dielectric layer 316 within the second trench 318. In aspects, the barrier layer 240 may engage the surfaces of the first conductive layer 238 in the second trench 318. The second conductive layer 242 may be formed above the barrier layer 240. In aspects, the second conductive layer 242 may engage the surfaces of the barrier layer 240. In other words, the barrier layer 240 may be disposed between the first conductive layer 238 and second conductive layer 242. In certain aspects, the second conductive layer 242 may form a conductive core inside the second trench 318.

Figure 3G:
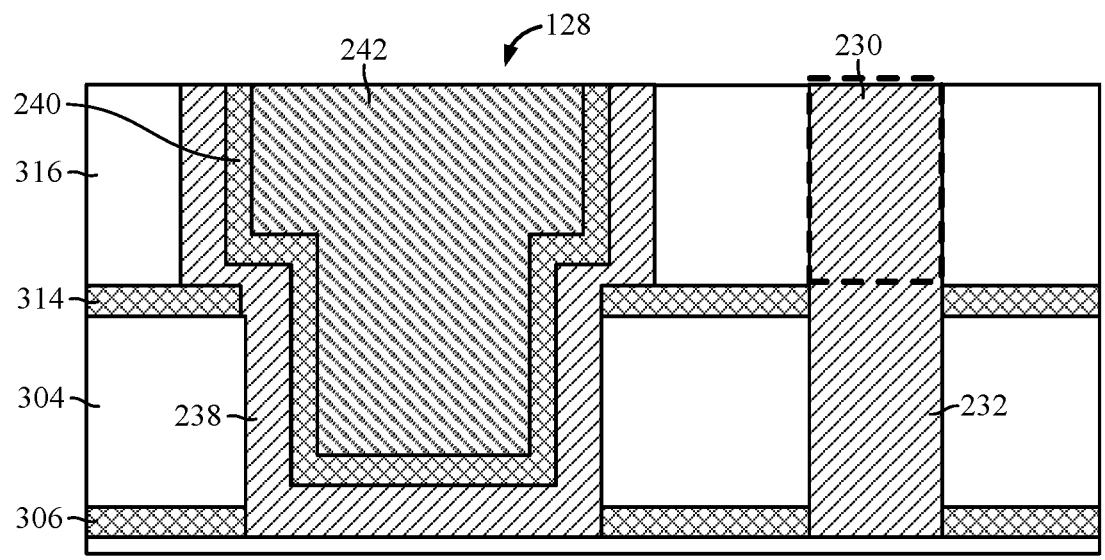
FIG. 3G illustrates a cross-sectional view of a power rail, signal line, and conductive via formed in the dielectric layers, in accordance with certain aspects of the present disclosure.

Referring to FIG. 3G, a planarization process (e.g., a chemical-mechanical planarization (CMP) process) may be performed to smooth the surface of the second dielectric layer 316 and remove any excess conductive material from the deposition of the first conductive layer 238, barrier layer 240, and/or second conductive layer 242. As shown, a power rail 128, a signal line 230, and a conductive via 232 may be formed in the dielectric layers 304, 316, for example, as depicted in FIGS. 2A-2C.

FIGS. 4A-4G illustrate example operations for fabricating a power rail and conductive vias using a multi-damascene (e.g., a dual damascene) process, in accordance with certain aspects of the present disclosure. The operations may be performed by an integrated circuit processing facility, for example. FIGS. 4A-4G illustrate cross-sectional views of the example operations described herein. In certain aspects, the operations may include various BEOL operations, including, for example, etching, planarization, depositions, etc.

Figure 4A:
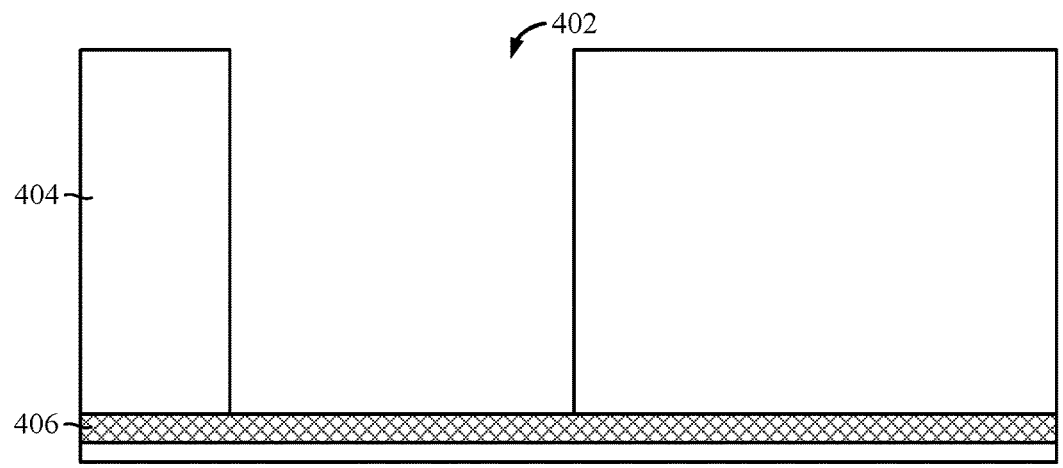
FIG. 4A illustrates a cross-sectional view of one or more dielectric layers with a first trench formed therein, in accordance with certain aspects of the present disclosure.

As shown in FIG. 4A, a first trench 402 may be formed in one or more dielectric layers 404, for example, using an etching process (e.g., a dry etching and/or wet etching process). In aspects, portions of the first trench 402 may serve as a mold for forming the via layer portion and metal layer portion of a power rail, for example, as depicted in FIG. 2A. In aspects, the first trench 402 may be selectively etched from the dielectric layer 404, such that the first trench 402 is formed in the dielectric layer 404 without intersecting an etch stop layer 406 disposed below the dielectric layer 404.

Figure 4B:
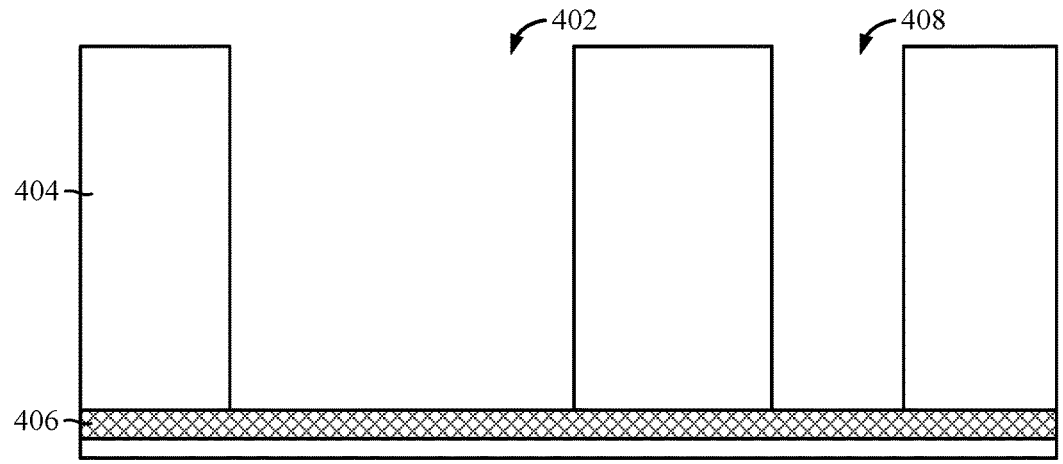
FIG. 4B illustrates a cross-sectional view of a cavity formed in the one or more dielectric layers, in accordance with certain aspects of the present disclosure.

Referring to FIG. 4B, a cavity 408 may be formed in the one or more dielectric layers 404, for example, using an etching process such as a dry etching and/or wet etching process. A portion of the cavity 408 may serve as the mold for forming a conductive via (e.g., the conductive via 232 of FIG. 2A).

Figure 4C:
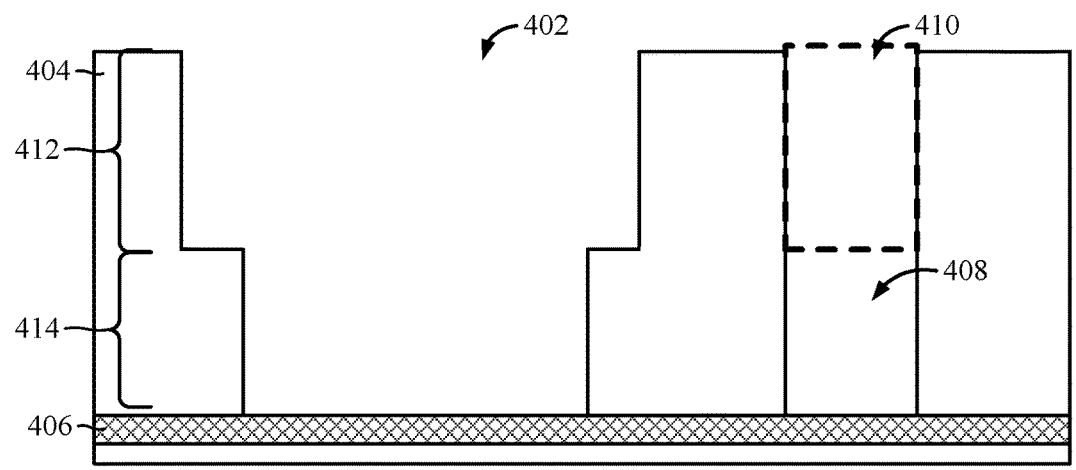
FIG. 4C illustrates a cross-sectional view of a second trench formed in the one or more dielectric layers, in accordance with certain aspects of the present disclosure.

As depicted in FIG. 4C, a second trench 410 may be formed in the one or more dielectric layers 404, for example, using an etching process such as a dry etching and/or wet etching process. The second trench 410 may intersect a portion of the cavity 408. The second trench 410 may serve as a mold for forming a signal line, for example, as depicted in FIG. 2A. The first trench 402 may be expanded such that a first portion 412 of the first trench 402 overhangs at least one of side of a second portion 414 of the first trench 402. In aspects, the first portion 412 of the first trench 402 may serve as a mold for forming the metal layer portion of the power rail, for example, as depicted in FIG. 2C, and the second portion 414 of the first trench 402 may serve as a mold for forming the via layer portion of the power rail, for example, as depicted in FIG. 2C.

Figure 4D:
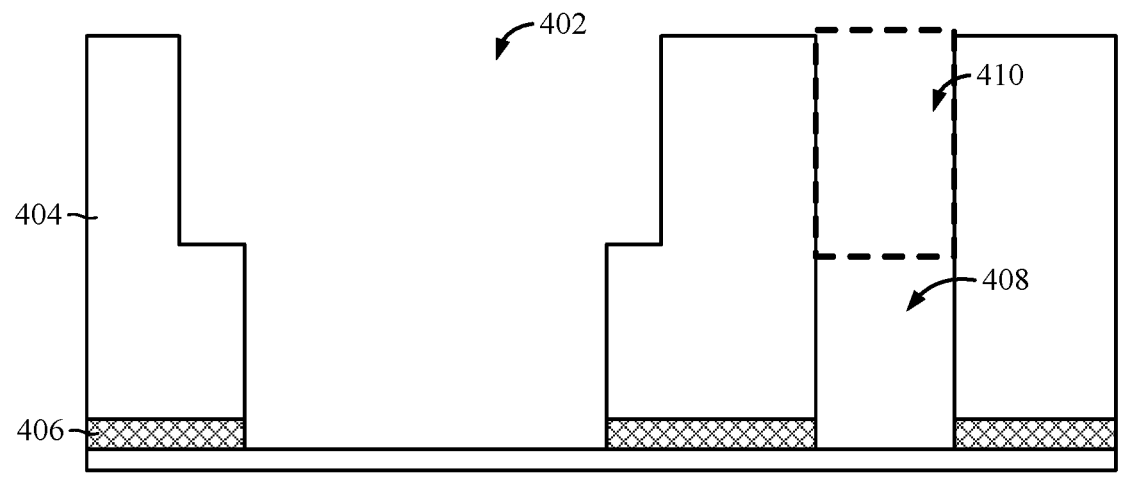
FIG. 4D illustrates a cross-sectional view of the first trench and cavity intersecting an etch stop layer disposed below the one or more dielectric layers, in accordance with certain aspects of the present disclosure.

As illustrated in FIG. 4D, the first trench 402 may be expanded to intersect the etch stop layer 406. In aspects, the cavity 408 may also be expanded to intersect the etch stop layer 406.

Figure 4E:
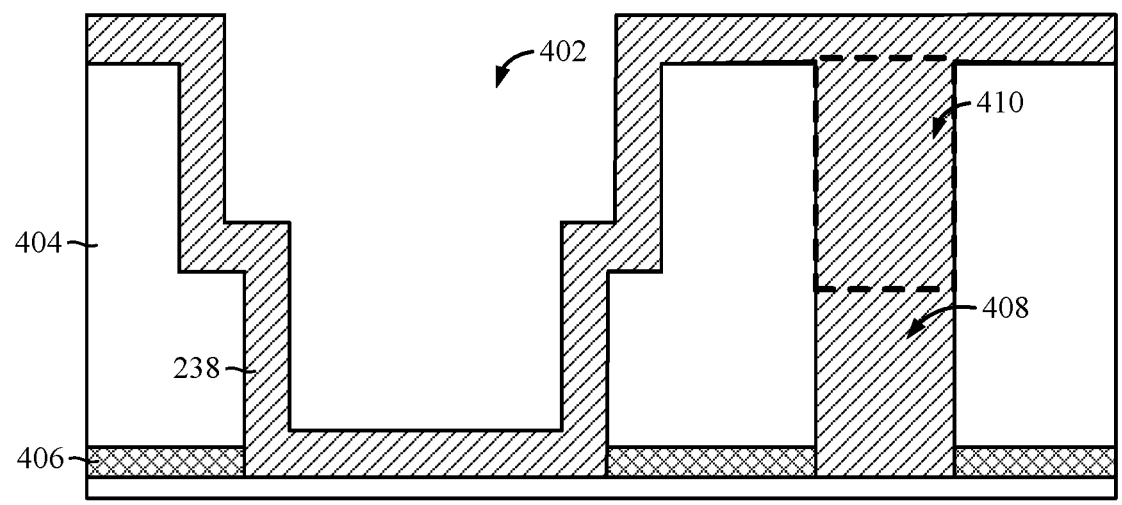
FIG. 4E illustrates a cross-sectional view of a first conductive layer disposed in the first trench, second trench, and cavity, in accordance with certain aspects of the present disclosure.

Referring to FIG. 4E, the first conductive layer 238 may be formed in the first trench 402, second trench 410, and cavity 408. Inside the first trench 402, the first conductive layer 238 may engage the surfaces of the one or more dielectric layers 404. In certain aspects, the second trench 410 and cavity 408 may be filled with the conductive material of the first conductive layer 238. That is, a signal line, conductive via, and first conductive layer of a power rail may be formed using the same deposition process of a conductive material under this example dual damascene process.

Figure 4F:
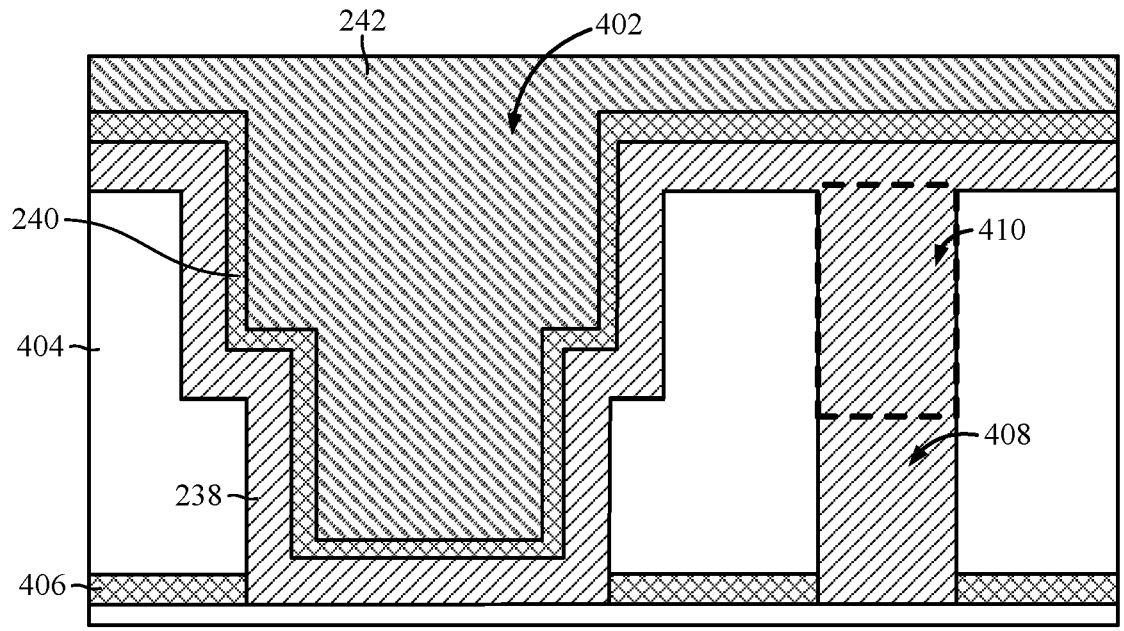
FIG. 4F illustrates a cross-sectional view of a barrier layer and second conductive layer disposed in the first trench, in accordance with certain aspects of the present disclosure.

As depicted in FIG. 4F, the barrier layer 240 may be formed above the first conductive layer 238 in the first trench 402. In other words, the first conductive layer 238 may be disposed between the barrier layer 240 and the surfaces of the one or more dielectric layers 404 within the first trench 402. In aspects, the barrier layer 240 may engage the surfaces of the first conductive layer 238 in the first trench 402. The second conductive layer 242 may be formed above the barrier layer 240. In aspects, the second conductive layer 242 may engage the surfaces of the barrier layer 240. In other words, the barrier layer 240 may be disposed between the first conductive layer 238 and second conductive layer 242. In certain aspects, the second conductive layer 242 may form a conductive core inside the first trench 402.

Figure 4G:
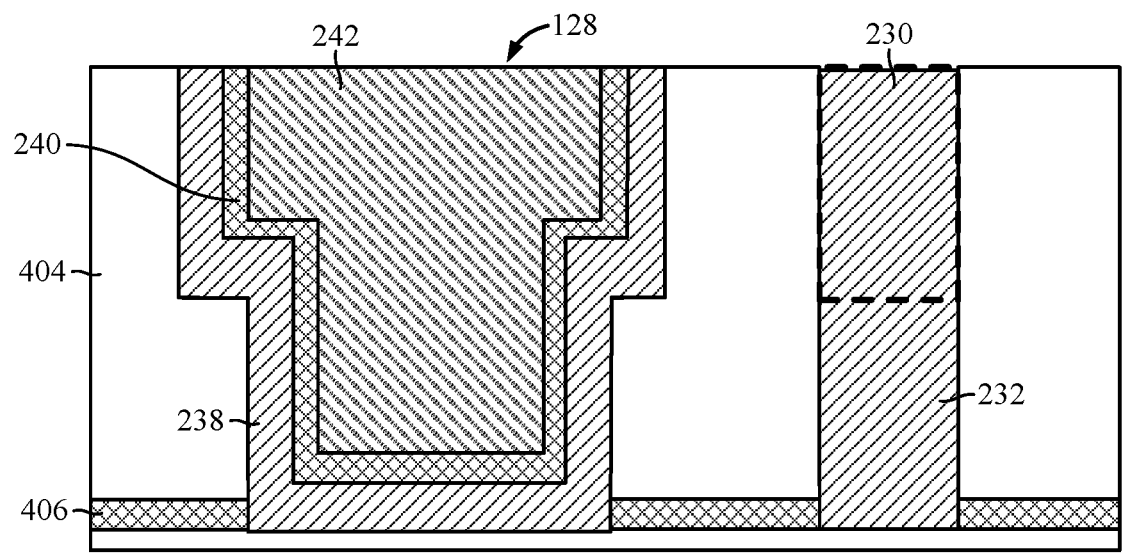
FIG. 4G illustrates a cross-sectional view of a power rail, signal line, and conductive via formed in the dielectric layer, in accordance with certain aspects of the present disclosure.
Figure 5:
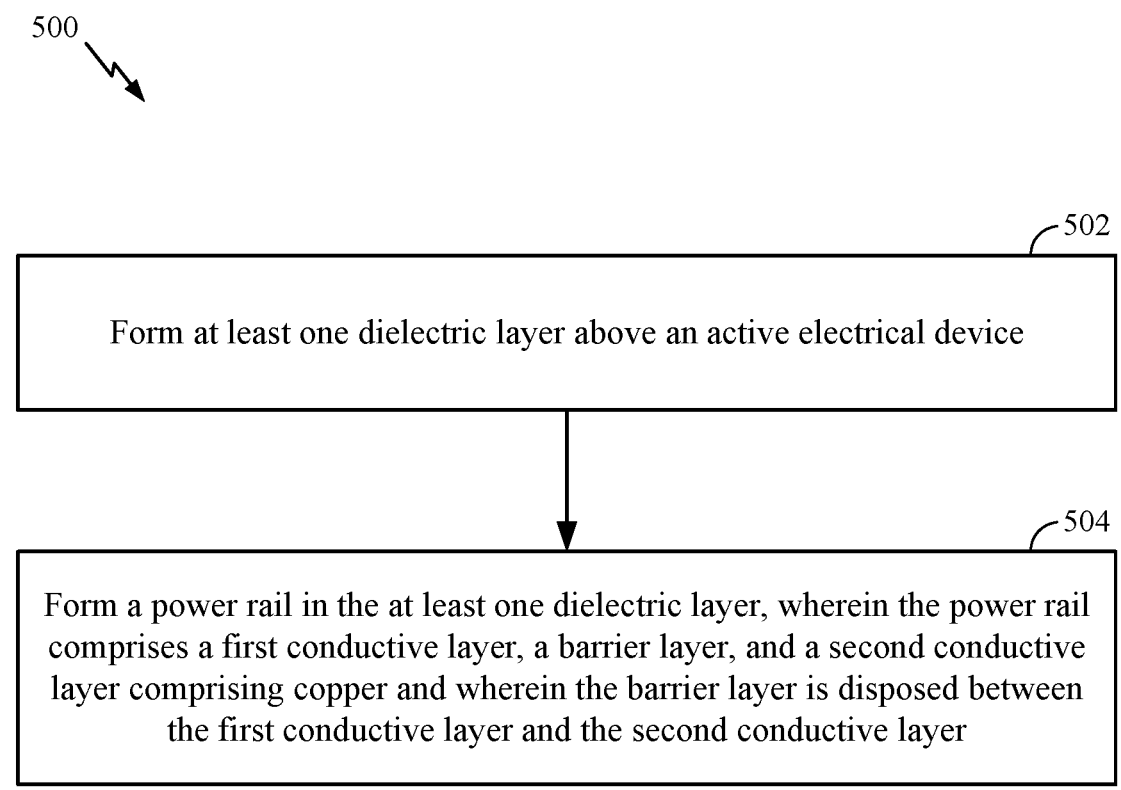
FIG. 5 is a flow diagram of example operations for fabricating a semiconductor device, in accordance with certain aspects of the present disclosure.

Referring to FIG. 4G, a planarization process (e.g., a chemical-mechanical planarization (CMP) process) may be performed to smooth the surface of the one or more dielectric layers 404 and remove any excess conductive material from the deposition of the first conductive layer 238, barrier layer 240, and/or second conductive layer 242. As shown, a power rail 128, a signal line 230, and a conductive via 232, may be formed in the one or more dielectric layers 404, for example, as depicted in FIGS. 2A-2C FIG. 5 is a flow diagram of example operations 500 for fabricating a semiconductor device (e.g., the semiconductor device 100 of FIG. 1), in accordance with certain aspects of the present disclosure. The operations 500 may be performed by an integrated circuit fabrication facility, for example.

The operations 500 begin, at block 502, by forming at least one dielectric layer (e.g., the one or more dielectric layers 108, first dielectric layer 304, second dielectric layer 316, or one or more dielectric layers 404) above an active electrical device (e.g., the active electrical device 106). At block 504, a power rail (e.g., the power rail 128) may be formed in the at least one dielectric layer, where the power rail comprises a first conductive layer (e.g., the first conductive layer 238), a barrier layer (e.g., the barrier layer 240), and a second conductive layer (e.g., the second conductive layer 242) comprising copper. In aspects, the barrier layer is disposed between the first conductive layer and the second conductive layer.

The operations 500 may include forming a local conductive interconnect (e.g., the local conductive interconnect 110) electrically coupled between the active electrical device and the power rail. In aspects, the active electrical device may include a transistor, and the local conductive interconnect may be electrically coupled to a source or drain of the transistor In aspects, the power rail may include a conductive portion (e.g., the metal layer portion 234) that is in a metal layer disposed closest to the active electrical device relative to other metal layers of the semiconductor device. In aspects, the operations 500 may further include forming a signal line laterally spaced from the power rail and disposed in the metal layer.

In aspects, the power rail may include a metal layer portion (e.g., the metal layer portion 234) embedded in a first dielectric layer (e.g., the first dielectric layer 108A) of the at least one dielectric layer and a via layer portion (e.g., the via layer portion 236) embedded in a second dielectric layer (e.g., the second dielectric layer 108B) of the at least one dielectric layer. In aspects, lateral surfaces of the second conductive layer may be coupled to the first conductive layer in the via layer portion. In aspects, the metal layer portion is disposed above and overhangs the via layer portion on at least one side of the power rail. The via layer portion of the power rail may include a copper pillar (e.g., the copper pillar 246) associated with the second conductive layer, and lateral surfaces of the copper pillar are surrounded by at least one of the barrier layer or the first conductive layer in the via layer portion. In aspects, the second dielectric layer is disposed between the metal layer portion and the active electrical device.

In certain aspects, the power rail may be formed using a single damascene process, for example, as described herein with respect to FIGS. 3A-3G. In certain cases, forming the power rail at 504 may include forming a first trench (e.g., the first trench 302) that intersects a first dielectric layer (e.g., the first dielectric layer 304) of the at least one dielectric layer, depositing a sacrificial material (e.g., the sacrificial material 308) in the first trench, and forming a second dielectric layer (e.g., the second dielectric layer 316) of the at least one dielectric layer above the first dielectric layer and the sacrificial material. Under the single damascene process, forming the power rail at 504 may further include forming a second trench (e.g., the second trench 318) that intersects the second dielectric layer and the first dielectric layer, where forming the second trench comprises removing the sacrificial material. Under the single damascene process, forming the power rail at 504 may also include depositing the first conductive layer in the second trench, depositing the barrier layer above the first conductive layer in the second trench, and forming the second conductive layer above the barrier layer in the second trench.

Under the single damascene process, forming the second trench may include forming a first portion (e.g., a metal layer portion) of the second trench that overhangs a second portion (e.g., a via layer portion) of the second trench, which includes the first trench on at least one side of the power rail.

Under the single damascene process, the operations 500 may further include forming a cavity (e.g., the cavity 310) in the first dielectric layer adjacent to the first trench and depositing the same conductive material as the first conductive layer in the cavity, for example, as described herein with respect to FIG. 3B.

In certain aspects, the power rail may be formed using a dual damascene process, for example, as described herein with respect to FIGS. 4A-4G. In certain cases, forming the power rail at 504 may include forming a first trench (e.g., the first trench 402) that intersects the at least one dielectric layer, forming a cavity (e.g., the cavity 408) adjacent to the first trench in the at least one dielectric layer, and forming a second trench (e.g., the second trench 410) in the at least one dielectric layer, where the second trench intersects a portion of the cavity. Under the dual damascene process, forming the power rail at 504 may further include depositing the first conductive layer in the first trench, the second trench, and the cavity. Under the dual damascene process, forming the power rail at 504 may also include depositing the barrier layer above the first conductive layer in the first trench and forming the second conductive layer above the barrier layer in the first trench. Under the dual damascene process, the operations 500 may further include expanding a first portion (e.g., the first portion 412) of the first trench that overhangs a second portion (e.g., the second portion 414) of the first trench.

In aspects, the first conductive layer may include at least one of cobalt (Co), ruthenium (Ru), molybdenum (Mo), or tungsten (W). In aspects, the first conductive layer may engage the at least one dielectric layer on multiple surfaces (e.g., the surfaces 244) of the power rail. In certain aspects, the barrier layer may include at least one of tantalum (Ta), tantalum nitride (TaN), titanium nitride (TiN), or titanium-tungsten (TiW).

It should be appreciated that a power rail having a hybrid conductor integrated in a metal layer portion and via layer portion enables a reduced line resistance compared to a copper power rail, especially in instances where the width of a power rail is less than 35 nm. The reduced line resistance across a power rail may improve the electrical performance in supplying power to active electrical devices, such as transistors, in an integrated circuit.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A semiconductor device comprising:
an active electrical device; and
a power rail electrically coupled to the active electrical device, disposed above the active electrical device, and embedded in at least one dielectric layer, wherein:
the power rail comprises a first conductive layer, a barrier layer, and a second conductive layer comprising copper;
the barrier layer is disposed between the first conductive layer and the second conductive layer; and
the first conductive layer, the barrier layer, and the second conductive layer extend across a plurality of active electrical devices including the active electrical device.

2. The semiconductor device of claim 1, wherein the first conductive layer comprises at least one of cobalt (Co), ruthenium (Ru), molybdenum (Mo), or tungsten (W).

3. The semiconductor device of claim 1, wherein the first conductive layer engages the at least one dielectric layer on multiple surfaces of the power rail.

4. The semiconductor device of claim 1, wherein the barrier layer comprises at least one of tantalum (Ta), tantalum nitride (TaN), titanium nitride (TiN), or titanium-tungsten (TiW).

5. The semiconductor device of claim 1, wherein:
the power rail comprises:
a metal layer portion embedded in a first dielectric layer of the at least one dielectric layer; and
a via layer portion embedded in a second dielectric layer of the at least one dielectric layer; and
lateral surfaces of the second conductive layer are coupled to the first conductive layer in the via layer portion.

6. The semiconductor device of claim 5, wherein the metal layer portion is disposed above and overhangs the via layer portion on at least one side of the power rail.

7. The semiconductor device of claim 5, wherein the via layer portion of the power rail comprises a copper pillar associated with the second conductive layer and wherein lateral surfaces of the copper pillar are surrounded by at least one of the barrier layer or the first conductive layer in the via layer portion.

8. The semiconductor device of claim 5, wherein the second dielectric layer is disposed between the metal layer portion and the active electrical device.

9. A semiconductor device comprising:
an active electrical device; and
a power rail electrically coupled to the active electrical device, disposed above the active electrical device, and embedded in at least one dielectric layer, wherein the power rail comprises a first conductive layer, a barrier layer, and a second conductive layer comprising copper, and wherein the barrier layer is disposed between the first conductive layer and the second conductive layer; and
a local interconnect electrically coupled between the active electrical device and the power rail, wherein the power rail comprises a conductive portion that is in a metal layer disposed closest to the active electrical device relative to other metal layers of the semiconductor device.

10. The semiconductor device of claim 9, further comprising a signal line laterally spaced from the power rail and disposed in the metal layer, wherein the signal line comprises a same conductive material as the first conductive layer.

11. The semiconductor device of claim 9, wherein the active electrical device includes a transistor and wherein the local interconnect is electrically coupled to a source or drain of the transistor.

12. A method of fabricating a semiconductor device, comprising:
forming at least one dielectric layer above an active electrical device; and forming a power rail embedded in the at least one dielectric layer and electrically coupled to the active electrical device, wherein:
the power rail comprises a first conductive layer, a barrier layer, and a second conductive layer comprising copper;
the barrier layer is disposed between the first conductive layer and the second conductive layer; and
the first conductive layer, the barrier layer, and the second conductive layer extend across a plurality of active electrical devices including the active electrical device.

13. The method of claim 12, further comprising:
forming a local interconnect electrically coupled between the active electrical device and the power rail.

14. The method of claim 12, wherein the power rail comprises a conductive portion that is in a metal layer disposed closest to the active electrical device relative to other metal layers of the semiconductor device.

15. The method of claim 12, wherein forming the power rail comprises:
forming a first trench that intersects a first dielectric layer of the at least one dielectric layer;
depositing a sacrificial material in the first trench;
forming a second dielectric layer of the at least one dielectric layer above the first dielectric layer and the sacrificial material;
forming a second trench that intersects the second dielectric layer and the first dielectric layer, wherein forming the second trench comprises removing the sacrificial material;
depositing the first conductive layer in the second trench;
depositing the barrier layer above the first conductive layer in the second trench; and
forming the second conductive layer above the barrier layer in the second trench.

16. The method of claim 15, wherein forming the second trench comprises forming a first portion of the second trench that overhangs a second portion of the second trench, which includes the first trench on at least one side of the power rail.

17. The method of claim 15, further comprising:
forming a cavity in the first dielectric layer adjacent to the first trench; and
depositing a same conductive material as the first conductive layer in the cavity.

18. The method of claim 12, wherein forming the power rail comprises:
forming a first trench that intersects the at least one dielectric layer;
forming a cavity adjacent to the first trench in the at least one dielectric layer;
forming a second trench in the at least one dielectric layer, wherein the second trench intersects a portion of the cavity;
depositing the first conductive layer in the first trench, the second trench, and the cavity;
depositing the barrier layer above the first conductive layer in the first trench; and
forming the second conductive layer above the barrier layer in the first trench.

19. The method of claim 18, further comprising expanding a first portion of the first trench that overhangs a second portion of the first trench.

20. The method of claim 12, wherein:
the first conductive layer comprises at least one of cobalt (Co), ruthenium (Ru), molybdenum (Mo), or tungsten (W); and
the barrier layer comprises at least one of tantalum (Ta), tantalum nitride (TaN), titanium nitride (TiN), or titanium-tungsten (TiW).

* * * * *